(12) United States Patent
Ono

(10) Patent No.: US 7,952,248 B2
(45) Date of Patent: May 31, 2011

(54) PIEZOELECTRIC GENERATOR

(75) Inventor: Yasuhiro Ono, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/757,245

(22) Filed: Apr. 9, 2010

(65) Prior Publication Data

US 2010/0264779 A1    Oct. 21, 2010

(30) Foreign Application Priority Data

Apr. 15, 2009   (JP) .................. 2009-098722

(51) Int. Cl.
*H01L 41/08*   (2006.01)
(52) U.S. Cl. .................. 310/129; 310/339; 310/358
(58) Field of Classification Search .................. 310/329, 310/339, 358
See application file for complete search history.

(56) References Cited

U.S. PATENT DOCUMENTS

| 3,584,243 A  * | 6/1971  | Fabian ............................. 310/329 |
| 5,155,408 A  * | 10/1992 | Takeuchi ......................... 310/339 |
| 5,386,726 A  * | 2/1995  | Terajima ...................... 73/504.16 |
| 5,512,794 A  * | 4/1996  | Kubler et al. .................. 310/329 |
| 5,661,361 A  * | 8/1997  | Lysen ............................. 310/329 |
| 5,801,475 A  * | 9/1998  | Kimura .......................... 310/319 |
| 7,299,695 B2 * | 11/2007 | Tanaka et al. ................... 73/510 |

FOREIGN PATENT DOCUMENTS

| JP | 07-107752   | 4/1995  |
| JP | 2007-282355 | 10/2007 |

* cited by examiner

*Primary Examiner* — Mark Budd
(74) *Attorney, Agent, or Firm* — Maschoff Gilmore & Israelsen

(57) ABSTRACT

A generator that collects oscillation energy to convert to electric energy, the generator including a support portion made of non-piezoelectric material, a piezoelectric body disposed on the support portion and having a polarization direction perpendicular to a longitudinal direction of the support portion, the piezoelectric body being configured to oscillate in an oscillating direction to generate the oscillation energy, the oscillating direction perpendicular to the polarization direction, a first electrode provided on a first surface of the piezoelectric body parallel to the polarization direction, a second electrode provided on a second surface of the piezoelectric body parallel to the polarization direction, and a weight disposed on a third surface of the piezoelectric body facing the support portion.

3 Claims, 5 Drawing Sheets

PIEZOELECTRIC GENERATOR

This application claims priority to Japanese Patent Application No. 2009-098722, filed Apr. 15, 2009, the entirety of which is hereby incorporated by reference.

BACKGROUND

1. Technical Field

The present invention relates to a piezoelectric generator including a piezoelectric body.

2. Related Art

A piezoelectric generator including a piezoelectric body is disclosed in JP-A-7-107752, for example. This type of piezoelectric generator uses a piezoelectric converting element which has piezoelectric ceramic plates affixed to both surfaces of a phosphor bronze plate. The piezoelectric converting element fixed to a substrate via a fixed end projects from the substrate in a cantilevered manner. A weight is attached to a projection end of the piezoelectric converting element. When intermittent oscillation is applied to the weight with a reference point set at the fixed end, the piezoelectric converting element is smoothly oscillated. As a result, the piezoelectric ceramic plates are distorted, allowing alternating voltage to be generated.

According to the piezoelectric generator disclosed in JP-A-7-107752, however, the oscillation mode contributing to electric power generation is so-called d31 mode which uses oscillation energy having a direction orthogonal to the polarization direction of the piezoelectric converting element and also orthogonal to the facing direction of electrodes. In this case, the efficiency of electric power generation lowers.

SUMMARY

It is an advantage of some aspects of the invention to provide a piezoelectric generator capable of collecting oscillation energy in d15 mode which achieves high electric power generation efficiency.

A piezoelectric generator which collects oscillation energy applied from an external source and converts the oscillation energy into electric energy according to an aspect of the invention includes: a support portion made of non-piezoelectric material; a piezoelectric body disposed on the support portion and having the polarization direction perpendicular to the support portion; electrodes provided on the surfaces of the piezoelectric body opposed to each other and parallel with the polarization direction of the piezoelectric body; and a weight disposed on the piezoelectric body on the side opposite to the support portion. The piezoelectric generator generates electric power by using oscillation energy in the direction orthogonal to the polarization direction and parallel with the facing direction of the electrodes.

According to this piezoelectric generator, the weight is provided on the piezoelectric body on the side opposite to the support portion. The polarization direction of the piezoelectric body coincides with the direction perpendicular to the support portion. The electrodes are provided on the surfaces of the piezoelectric body opposed to each other and parallel with the polarization direction of the piezoelectric body. Accordingly, electric power is generated by using oscillation energy in the direction orthogonal to the polarization direction of the piezoelectric body and parallel with the facing direction of the electrodes, that is, in d15 mode, and thus the electric power generation efficiency is improved.

The piezoelectric generator may be configured such that each width of the surfaces of the piezoelectric body where the electrodes are formed is larger than each width of the surfaces of the piezoelectric body where the electrodes are not formed.

According to this structure, distortion produced on the piezoelectric body is increased, and thus the electric power generation efficiency can be further improved.

The piezoelectric generator may be configured such that the thickness of the weight lies in the range from the thickness of the piezoelectric body to a thickness twice larger than the thickness of the piezoelectric body.

According to this structure, both increase in the energy efficiency and decrease in the resonance frequency can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENT

A piezoelectric generator according to an embodiment of the invention is hereinafter described with reference to the drawings.

Figure 1:
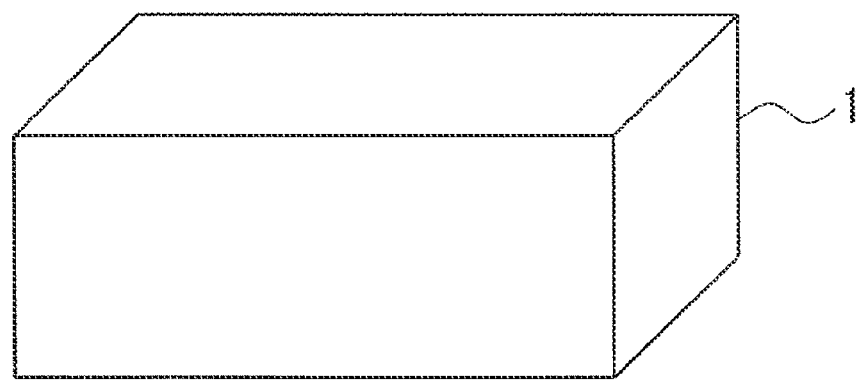
FIG. 1 illustrates a step for manufacturing a piezoelectric generator according to an embodiment of the invention.

FIGS. 1 through 8 illustrate steps for manufacturing the piezoelectric generator according to this embodiment. FIG. 1 shows a support portion 1 of the piezoelectric generator in this embodiment. The support portion 1 is made of non-piezoelectric material. In this embodiment, the support portion 1 is a rectangular parallelepiped component made of alumina. Examples of the non-piezoelectric material constituting the support portion 1 include zirconia, silicon, silicon nitride, silicon carbide, quartz, organic polymer, and others as well as alumina.

Figure 2:
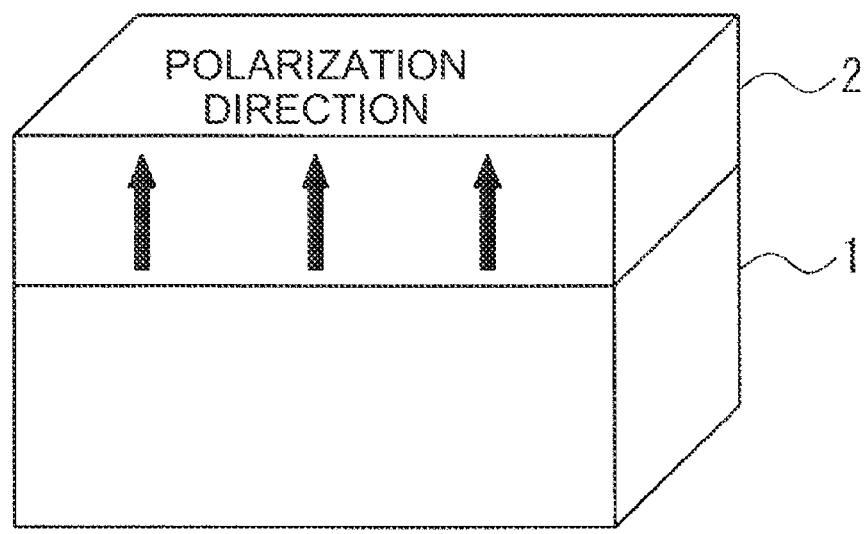
FIG. 2 illustrates a manufacturing step subsequent to the step shown in FIG. 1.

FIG. 2 shows a piezoelectric body 2 stacked on the support portion 1. The polarization direction of the piezoelectric body 2 is a direction moving away from the support portion 1 or closer to the support portion 1, that is, a direction perpendicular to the support portion 1. In this embodiment, the piezoelectric body 2 is made of PZT having a thickness of 3 mm, and is bonded to the upper surface of the support portion 1 by an adhesive such as two-part epoxy. Examples of the material constituting the piezoelectric body 2 include PZTN, $BaTiO_3$, ZnO, AlN, $LiNbO_3$, $LiTaO_3$, and others as well as PZT. The thickness of the piezoelectric body 2 lies in the range from 0.1 to 10 mm. The piezoelectric body 2 may be formed by two or more layers of piezoelectric materials of the same or different types. The piezoelectric body 2 may contain an electrode.

However, contact between the contained electrode and external electrodes described later is not allowed.

Figure 3:
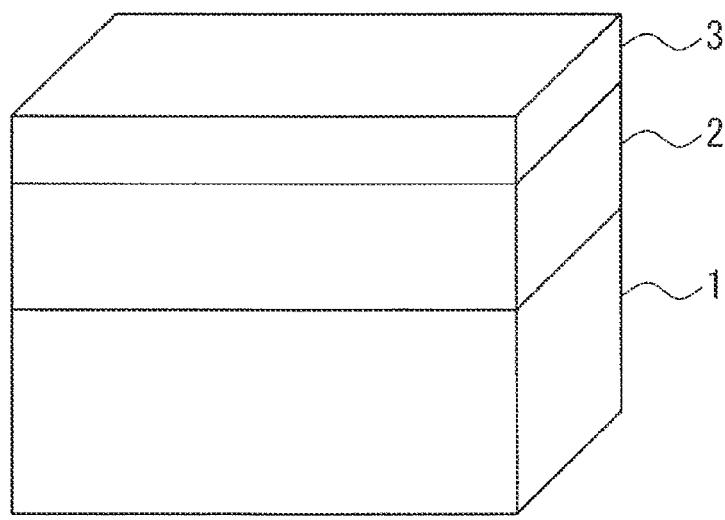
FIG. 3 illustrates a manufacturing step subsequent to the step shown in FIG. 2.

FIG. 3 shows a weight 3 stacked on the piezoelectric body 2. In this embodiment, the weight 3 is made of zirconia. The material constituting the weight 3 is not particularly limited as long as it has insulating properties. The weight 3 increases amplitude of the deformation of the piezoelectric body 2 and hence improves efficiency in electric power generation. Although not illustrated in FIG. 3, it is favorable to configure the thickness of the weight 3 to be the same or larger than that of the piezoelectric body 2, but no larger than the thickness twice as large as that of the piezoelectric body 2. When the thickness of the weight 3 is larger than the thickness twice larger than the thickness of the piezoelectric body 2, that suppresses the resonance frequency but lowers the energy efficiency. The weight 3 is bonded to the upper surface of the piezoelectric body 2 by an adhesive such as two-part epoxy.

Figure 4:
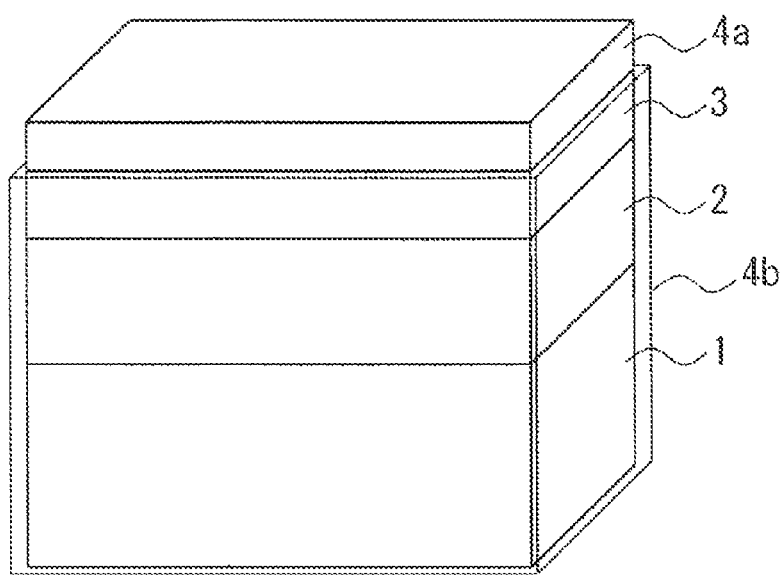
FIG. 4 illustrates a manufacturing step subsequent to the step shown in FIG. 3.

FIG. 4 shows masks 4a and 4b provided on the outer circumference of the area from the support portion 1 to the weight 3. The mask 4a for both processing and protection is provided on the upper surface of the weight 3 such that the weight 3 and the piezoelectric body 2 can be divided in the following process. The mask 4b for protection is provided on the sides of the weight 3, the piezoelectric body 2, and the support portion 1 and the lower surface of the support portion 1 in the figure. The masks 4a and 4b are formed by dry film or photo-resist, for example.

Figure 5:
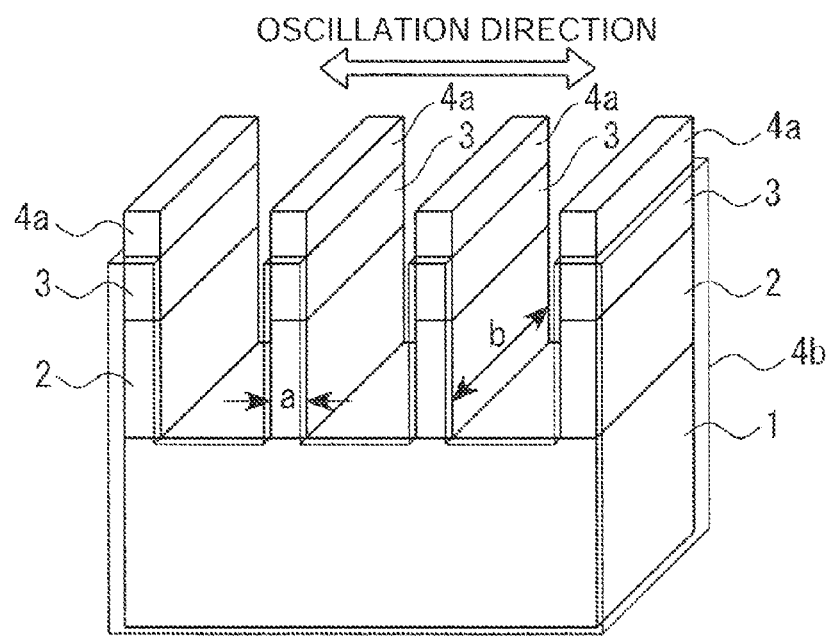
FIG. 5 illustrates a manufacturing step subsequent to the step shown in FIG. 4.

FIG. 5 shows grooves formed on the weight 3 and the piezoelectric body 2, by which grooves the weight 3 and the piezoelectric body 2 are divided into four parts. Each of the divided parts of the piezoelectric body 2 and the weight 3 becomes an element. The grooves are formed by using a wire saw. In this embodiment, the depths of the grooves reach the junction surfaces of the support portion 1 and the piezoelectric body 2. However, a small part of the piezoelectric body 2 may be left undivided. The direction of the oscillation energy corresponds to the left-right direction in the figure. In the groove forming process, a length a of each part of the piezoelectric body 2 in the oscillation direction (a width of each surface where an electrode described later is not formed) is made smaller than a length b in the direction orthogonal to the length a (a width of each surface where the electrode described later is formed). In this embodiment, the length a is 0.1 mm, and the length b is 1 mm. When the length a of each part of the piezoelectric body 2 in the oscillation direction (the width of each surface where the electrode is not formed) is smaller than the length b in the direction orthogonal to the length a (the width of each surface where the electrode is formed), the piezoelectric body 2 can be easily oscillated. As a result, the distortion of the piezoelectric body 2 for the oscillation energy can be increased, and thus the electric power generation efficiency can be improved.

Figure 6:
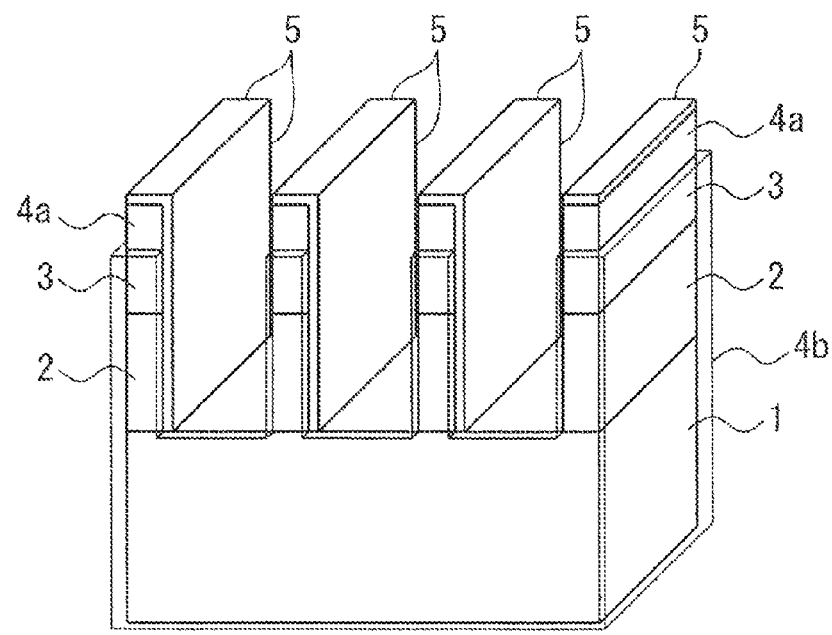
FIG. 6 illustrates a manufacturing step subsequent to the step shown in FIG. 5.

FIG. 6 shows electrodes 5 as one of opposed electrodes. The electrodes 5 are formed diagonally from the upper right of the figure by deposition, sputtering or other methods. The electrodes 5 are made of gold, silver, aluminum or the like. An adhesive layer made of Cr, Ti or the like may be used. In this case, a layer of 0.3 μmAu/0.1 μmCr is formed by diagonal sputtering.

Figure 7:
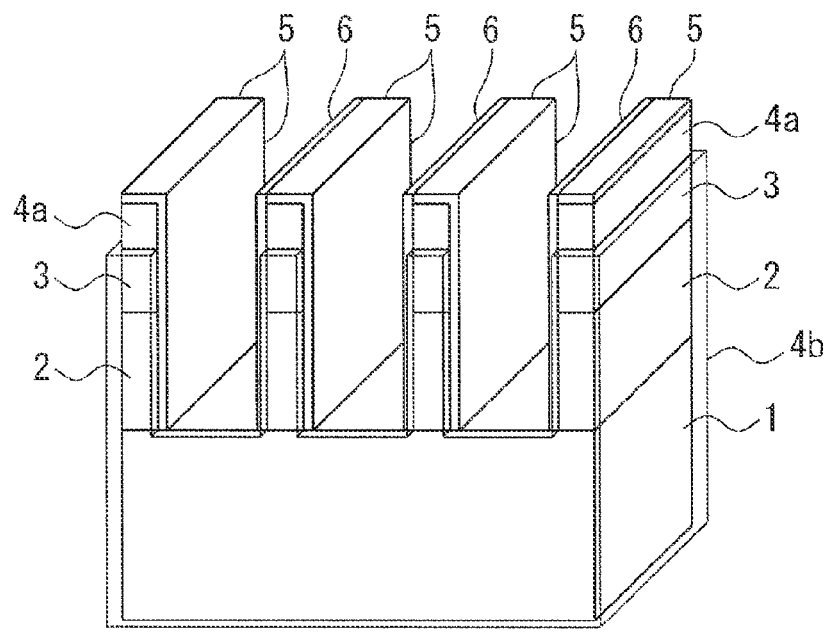
FIG. 7 illustrates a manufacturing step subsequent to the step shown in FIG. 6.

FIG. 7 shows electrodes 6 as the other of opposed electrodes. The electrodes 6 are formed diagonally from the upper left of the figure by deposition, sputtering or other methods similarly to the electrodes 5 in FIG. 6. The material and forming method of the electrodes 6 are similar to those of the electrodes 5 in FIG. 6.

Figure 8:
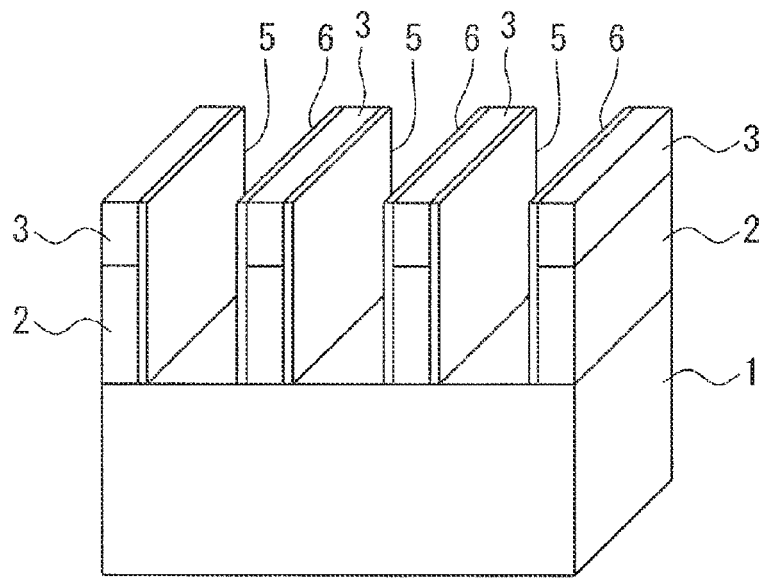
FIG. 8 illustrates a manufacturing step subsequent to the step shown in FIG. 7.

FIG. 8 illustrates the condition from which the mask 4a on the upper surface and the mask 4b on the side and the lower surface are removed by lift-off, that is, the completed condition. In this step, the electrodes 5 and 6 are separated from each other by lift-off.

Figure 9A:
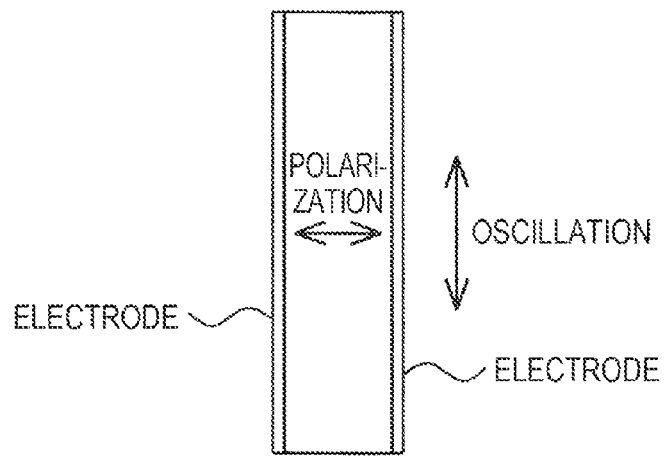
FIGS. 9A through 9C show oscillation modes.
Figure 9B:
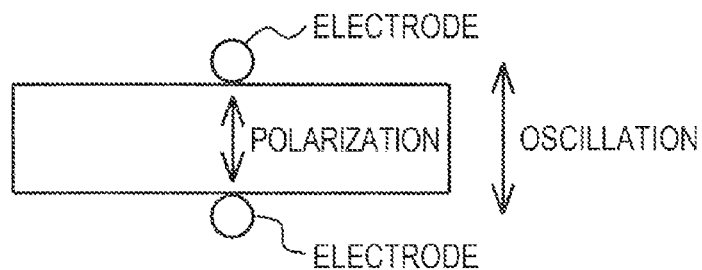
Figure 9C:
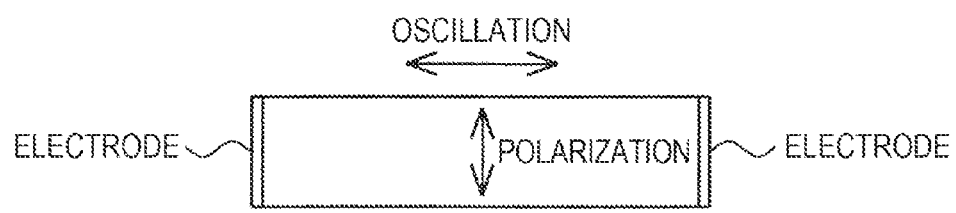

FIGS. 9A through 9C illustrate typical oscillation modes of a piezoelectric generator. FIG. 9A shows so-called d31 mode. In d31 mode, electrodes are formed on surfaces opposed to each other and orthogonal to the polarization direction, and the polarization direction cross the oscillation direction at right angles. In this case, the equivalent piezoelectric constant indicating the electric power generation efficiency is small. FIG. 9B shows so-called d33 mode. In d33 mode, electrodes are formed on surfaces opposed to each other and orthogonal to the polarization direction, and the polarization direction agrees with the oscillation direction. In this case, the equivalent piezoelectric constant indicating the electric power generation efficiency is larger than that in d31 mode, but is still relatively small. On the other hand, FIG. 9C shows so-called d15 mode corresponding to the mode in this embodiment. In d15 mode, electrodes are formed on surfaces opposed to each other and parallel with the polarization direction, and the polarization direction cross the oscillation direction at right angles. In this case, the equivalent piezoelectric constant indicating the electric power generation efficiency is large.

As described herein, the piezoelectric generator in this embodiment which collects oscillation energy applied from an external source and converts the oscillation energy into electric energy includes the support portion 1 made of non-piezoelectric material, the piezoelectric body 2 disposed on the support portion 1 and having the polarization direction perpendicular to the support portion 1, the electrodes 5 and 6 provided on the surfaces of the piezoelectric body 2 opposed to each other and parallel with the polarization direction of the piezoelectric body 2, and the weight 3 disposed on the piezoelectric body 2 on the side opposite to the support portion 1. The piezoelectric generator having this structure generates electric power by using oscillation energy in the direction orthogonal to the polarization direction and parallel with the facing direction of the electrodes 5 and 6. Accordingly, electric power is generated in d15 mode, and thus the electric power generation efficiency is improved.

Moreover, the width of each surface of the piezoelectric body 2 where the electrode 5 or 6 is formed is made larger than the width of each surface where the electrode 5 or 6 is not formed. In this case, distortion produced on the piezoelectric body 2 is increased, and thus the electric power generation efficiency can be further improved.

Furthermore, the thickness of the weight 3 lies in the range from the thickness of the piezoelectric body 2 to a thickness twice larger than the thickness of the piezoelectric body 2. Thus, both increase in the energy efficiency and decrease in the resonance frequency can be achieved.

What is claimed is:
1. A generator that collects oscillation energy to convert to electric energy, the generator comprising:
    a support portion made of non-piezoelectric material;
    a piezoelectric body disposed on the support portion and having a polarization direction perpendicular to a longitudinal direction of the support portion, the piezoelectric body being configured to oscillate in an oscillating direction to generate the oscillation energy, the oscillating direction perpendicular to the polarization direction;
    a first electrode provided on a first surface of the piezoelectric body parallel to the polarization direction;
    a second electrode provided on a second surface of the piezoelectric body parallel to the polarization direction; and a weight disposed on a third surface of the piezoelectric body facing the support portion.

2. The generator according to claim 1, wherein a length of the piezoelectric body in the polarization direction is larger than a length of the piezoelectric body in the oscillating direction.

3. The generator according to claim 1, wherein a length of the weight in the polarization direction of the piezoelectric body is no more than twice as large as the length of the piezoelectric body in the polarization direction.

* * * * *